United States Patent
Mecker

(10) Patent No.: US 7,435,097 B2
(45) Date of Patent: Oct. 14, 2008

(54) RADIAL CIRCUIT BOARD, SYSTEM, AND METHODS

(75) Inventor: Donald W. Mecker, San Clemente, CA (US)

(73) Assignee: Legacy Electronics, Inc., San Clemente, CA (US)

(*) Notice: Subject to any disclaimer, the term of this patent is extended or adjusted under 35 U.S.C. 154(b) by 59 days.

(21) Appl. No.: 11/328,737

(22) Filed: Jan. 10, 2006

(65) Prior Publication Data

US 2006/0164820 A1    Jul. 27, 2006

Related U.S. Application Data

(60) Provisional application No. 60/643,128, filed on Jan. 12, 2005.

(51) Int. Cl.
  *H01R 12/00* (2006.01)
(52) U.S. Cl. .................. 439/65; 439/74; 174/260; 361/784
(58) Field of Classification Search .............. 439/65, 439/61, 74–75; 361/788, 744, 784; 257/686; 174/260
  See application file for complete search history.

(56) References Cited

U.S. PATENT DOCUMENTS

| | | | |
|---|---|---|---|
| 3,239,719 A | 3/1966 | Shower | |
| 3,665,256 A | 5/1972 | Goun et al. | |
| 3,737,986 A | 6/1973 | Cranston | |
| 3,777,221 A | 12/1973 | Tatusko et al. | |
| 3,781,764 A * | 12/1973 | Johnson | 439/272 |
| 4,038,488 A | 7/1977 | Lin | |
| 4,245,877 A | 1/1981 | Auriana | |
| 4,288,841 A | 9/1981 | Gogal | |
| 4,322,778 A | 3/1982 | Barbour et al. | |
| 4,398,235 A | 8/1983 | Lutz et al. | |
| 4,437,235 A | 3/1984 | McIver | |
| 4,549,200 A | 10/1985 | Ecker et al. | |
| 4,616,655 A | 10/1986 | Weinberg et al. | |
| 4,632,293 A | 12/1986 | Feinstein | |
| 4,763,188 A | 8/1988 | Johnson | |
| 4,802,062 A | 1/1989 | Blum et al. | |
| 4,982,265 A | 1/1991 | Watanabe et al. | |
| 5,061,990 A | 10/1991 | Arakawa et al. | |

(Continued)

FOREIGN PATENT DOCUMENTS

DE    198 45 316 A1    12/1999

(Continued)

OTHER PUBLICATIONS

"Alterable Interposer Block for Personalizing Stacked Module Interconnections", 30(8) *IBM Tech. Disclosure Bulletin* 373-4 (1988).

*Primary Examiner*—Michael C Zarroli
(74) *Attorney, Agent, or Firm*—Dewey & LeBoeuf LLP; Jeff E. Schwartz

(57) ABSTRACT

The present invention relates to circuit boards with radially arrayed components. One specific embodiment is a memory circuit board with memory components, such as, for example, DRAM chips, radially arrayed around a central point. The present invention also relates to stacking and connecting multiple circuit boards with radially arrayed components. Another embodiment of the invention involves methods of preparing radially arrayed components on a circuit board module with substantially equidistant paths to the components.

37 Claims, 9 Drawing Sheets

U.S. PATENT DOCUMENTS

| | | | |
|---|---|---|---|
| 5,107,586 A | | 4/1992 | Eichelberger et al. |
| 5,128,831 A | | 7/1992 | Fox, III et al. |
| 5,130,894 A | | 7/1992 | Miller |
| 5,191,404 A | | 3/1993 | Wu et al. |
| 5,210,682 A | * | 5/1993 | Takashima ............... 361/744 |
| 5,239,198 A | | 8/1993 | Lin et al. |
| 5,239,447 A | | 8/1993 | Cotues et al. |
| 5,241,456 A | | 8/1993 | Marcinkiewicz et al. |
| 5,251,097 A | * | 10/1993 | Simmons et al. ............ 361/687 |
| 5,262,594 A | | 11/1993 | Edwin et al. |
| 5,285,352 A | | 2/1994 | Pastore et al. |
| 5,299,094 A | | 3/1994 | Nishino et al. |
| 5,301,089 A | * | 4/1994 | Takashima ............... 361/744 |
| 5,311,401 A | | 5/1994 | Gates, Jr. et al. |
| 5,311,407 A | | 5/1994 | Lumbard |
| 5,313,366 A | | 5/1994 | Gaudenzi et al. |
| 5,316,787 A | | 5/1994 | Frankeny et al. |
| 5,341,509 A | * | 8/1994 | Takashima ............... 710/317 |
| 5,377,077 A | | 12/1994 | Burns |
| 5,394,300 A | | 2/1995 | Yoshimura |
| 5,400,904 A | | 3/1995 | Maston, III et al. |
| 5,412,538 A | | 5/1995 | Kikinis et al. |
| 5,418,688 A | | 5/1995 | Hertz et al. |
| 5,445,526 A | * | 8/1995 | Hoshino et al. ............ 439/69 |
| 5,450,283 A | | 9/1995 | Lin et al. |
| 5,479,318 A | | 12/1995 | Burns |
| 5,492,223 A | | 2/1996 | Boardman et al. |
| 5,498,906 A | | 3/1996 | Roane et al. |
| 5,512,790 A | * | 4/1996 | Lachenmaier et al. ....... 307/112 |
| 5,514,907 A | | 5/1996 | Moshayedi |
| 5,539,254 A | * | 7/1996 | Eytcheson et al. ......... 257/691 |
| 5,570,274 A | | 10/1996 | Saito et al. |
| 5,579,207 A | | 11/1996 | Hayden et al. |
| 5,656,856 A | | 8/1997 | Kweon |
| 5,677,569 A | | 10/1997 | Choi et al. |
| 5,701,233 A | | 12/1997 | Carson et al. |
| D393,458 S | | 4/1998 | Merlin et al. |
| 5,739,581 A | | 4/1998 | Chillara et al. |
| 5,742,097 A | | 4/1998 | Matsunaga et al. |
| 5,744,827 A | | 4/1998 | Jeong et al. |
| 5,744,862 A | | 4/1998 | Ishii |
| 5,754,408 A | | 5/1998 | Derouiche |
| 5,757,079 A | | 5/1998 | McAllister et al. |
| 5,783,870 A | | 7/1998 | Mostafazadeh et al. |
| 5,790,378 A | | 8/1998 | Chillara |
| 5,810,609 A | | 9/1998 | Faraci et al. |
| 5,828,814 A | | 10/1998 | Cyman et al. |
| 5,869,353 A | | 2/1999 | Levy et al. |
| 5,869,356 A | | 2/1999 | Fuller, Jr. et al. |
| 5,903,432 A | * | 5/1999 | McMahon ............... 361/690 |
| 5,908,468 A | | 6/1999 | Hartmann |
| 5,910,885 A | | 6/1999 | Gulachenski et al. |
| 5,926,378 A | * | 7/1999 | DeWitt et al. ............. 361/788 |
| 5,982,633 A | | 11/1999 | Jeansonne |
| 6,014,316 A | | 1/2000 | Eide |
| D420,659 S | | 2/2000 | Shiroki |
| 6,028,352 A | | 2/2000 | Eide |
| 6,038,132 A | | 3/2000 | Tokunga et al. |
| 6,049,972 A | | 4/2000 | Link et al. |
| 6,072,122 A | | 6/2000 | Hosoya |
| 6,079,986 A | * | 6/2000 | Beshears ................ 439/63 |
| 6,081,429 A | | 6/2000 | Barrett |
| 6,084,293 A | | 7/2000 | Ohuchi |
| 6,084,780 A | | 7/2000 | Happoya |
| 6,093,249 A | | 7/2000 | Curtin |
| 6,101,100 A | | 8/2000 | Londa |
| 6,107,683 A | | 8/2000 | Castro et al. |
| RE36,916 E | | 10/2000 | Moshayedi |
| 6,160,718 A | | 12/2000 | Vakilian |
| 6,214,640 B1 | | 4/2001 | Fosberry et al. |
| 6,222,739 B1 | | 4/2001 | Bhakta et al. |
| 6,262,488 B1 | | 7/2001 | Masayuki et al. |
| 6,275,975 B1 | | 8/2001 | Lambrecht et al. |
| 6,291,259 B1 | | 9/2001 | Chun |
| 6,313,522 B1 | | 11/2001 | Akram et al. |
| 6,313,524 B1 | | 11/2001 | Pueschner et al. |
| 6,320,757 B1 | | 11/2001 | Liu |
| 6,363,846 B1 | | 4/2002 | Murakami |
| 6,388,335 B1 | | 5/2002 | Lam |
| 6,404,043 B1 | | 6/2002 | Isaak |
| 6,428,650 B1 | | 8/2002 | Chung |
| 6,445,591 B1 | | 9/2002 | Kwong |
| 6,462,284 B1 | | 10/2002 | Hashimoto |
| 6,469,376 B2 | | 10/2002 | Vaiyapuri |
| 6,472,735 B2 | | 10/2002 | Isaak |
| 6,559,539 B2 | | 5/2003 | Tu et al. |
| 6,566,746 B2 | | 5/2003 | Isaak et al. |
| 6,566,760 B1 | | 5/2003 | Kawamura et al. |
| 6,614,110 B1 | | 9/2003 | Pace |
| 6,618,267 B1 | | 9/2003 | Dalal et al. |
| 6,627,984 B2 | | 9/2003 | Bruce et al. |
| 6,628,527 B2 | | 9/2003 | Muramatsu et al. |
| 6,665,194 B1 | | 12/2003 | Patel et al. |
| 6,683,377 B1 | | 1/2004 | Shim et al. |
| 6,690,584 B2 | * | 2/2004 | Uzuka et al. ................ 361/796 |
| 6,777,798 B2 | | 8/2004 | Fukumoto et al. |
| 6,828,666 B1 | | 12/2004 | Herrell et al. |
| 6,924,556 B2 | | 8/2005 | Cha |
| 2002/0088355 A1 | | 7/2002 | Comulada |
| 2003/0122240 A1 | | 7/2003 | Lin et al. |
| 2003/0137808 A1 | | 7/2003 | Kledzik et al. |
| 2003/0168725 A1 | | 9/2003 | Warner et al. |
| 2003/0201526 A1 | | 10/2003 | Bolken et al. |

FOREIGN PATENT DOCUMENTS

| | | |
|---|---|---|
| DE | 100 29 259 A1 | 12/2001 |
| EP | 0 714 231 A2 | 5/1996 |
| JP | 64-46180 | 2/1989 |
| JP | 05-198158 | 8/1993 |
| JP | 08-051183 | 2/1996 |
| JP | 08-67153 | 3/1996 |
| JP | 09-245926 | 9/1997 |
| JP | 10-074769 | 3/1998 |
| JP | 11-111914 | 4/1999 |
| JP | 2000-031617 | 2/2000 |
| JP | 2000-343344 | 12/2000 |
| JP | 2003-521806 A | 7/2003 |
| WO | WO 00/35016 | 6/2000 |
| WO | WO 00/65652 A1 | 11/2000 |
| WO | WO 00/68996 A1 | 11/2000 |
| WO | WO 01/48819 A2 | 7/2001 |
| WO | WO 01/69680 A2 | 9/2001 |

* cited by examiner

RADIAL CIRCUIT BOARD, SYSTEM, AND METHODS

RELATED APPLICATIONS

The present application claims the benefit under 35 U.S.C. § 119(e) of U.S. provisional application Serial No. 60/643,128, filed on Jan. 12, 2005, entitled "Radial Circuit Board and System," which is incorporated herein by reference.

FIELD OF THE INVENTION

The present invention relates to circuit boards and more particularly to circuit boards with radially arrayed components. One specific embodiment is a circuit board with memory components, such as, for example, DRAM chips, radially arrayed around a central point.

BACKGROUND OF THE INVENTION

Designers of computer circuit boards contend with constraints relating to the length and path of lines connecting the various chips on the circuit board. In many circuit board applications there is a need to have data arrive at various chips at the same time during a data transfer. As the speed and data transfer rates increase and the size of chips decrease, this problem becomes more pronounced. Designers of computer memory boards are particularly hard pressed to assure that the data, address and control lines have uniform length between the memory chips and the various control chips. To ensure that data arrives at one chip in sync with data arriving at other chips, designers are often constrained to design data paths that are not the most direct path.

FIG. 1 provides a view of a typical computer memory board 10. In the typical memory board 10, memory chips 17 are arrayed in a linear pattern with control chips 19 located near the center. In order to assure that data is transferred on and off of the board in a coordinated pattern, the data lines from all of the chips to the control chip at the center of the board must be of approximately equal length. Thus, the lines connecting the outer most chips 17A must be the same lengths as the lines connecting the inner chips 17B. This need to have substantial uniformity in the length of the lines from all of the memory chips 17, whether they are the outer chips 17A, the inner chips 17B or otherwise, complicates the design and function of the board 10. The extra long lines in the current configuration waste precious board space and generate unnecessary and problematic heat. Furthermore, the lines to memory chips 17B that are close to the control chip 19 may require the line to zig zag back and forth in order to increase the path length.

SUMMARY OF THE INVENTION

The present invention relates to circuit boards, and more particularly to circuit boards with radially arrayed components. One specific embodiment is a circuit board module comprising a connector; a plurality of components radially arrayed substantially equidistant around the connector; and an array of equidistant electrical connections positioned between the connector and the components. The components may be memory chips such as DRAM or SRAM. The circuit board module may also comprise at least one input-output device, wherein the array of substantially equidistant electrical connections connects the connector and the input-output device; and a second array of substantially equidistant electrical connections positioned between the input-output device and the components. The control chip may be fully buffered. The input-output device may comprise a plurality of control chips. The circuit board module may further comprise alignment pins positioned on the circuit board module. The connector may comprise a connector with pressure pins or a male/female connector arrayed on the bottom of the circuit board module. The circuit board module may further comprise a pressure pin pad array or a second male/female connector positioned on the top of the circuit board module configured to connect with the pressure pin connector of a second circuit board module.

The circuit board module of the previous embodiment may further comprise a post mechanically connected to a second circuit board with a predetermined cross-sectional shape and the circuit board module may have a center aperture that is congruent with a peripheral edge of the predetermined cross-sectional shape of the post. The center aperture may have a first and second set of electrical contacts at its peripheral edge. The first and second set of electrical contacts may be configured such that when the circuit board is placed over the post so that its aperture is around the post, the first and second electrical contacts detachably connect to each other and provide an electrical connection and mechanical connection for the circuit board to the post. The post may include electrical connections between the second contacts and the second circuit board. This post may also have at least one conduit for the passage of air through it. This conduit may have a first opening for injection of air and at least one opening adjacent to the second set of electrical contacts to allow passage of air from the conduit and over the circular board.

Another embodiment of the present invention is a stackable memory system comprising a circuit board and a plurality of circuit board modules. In this embodiment, the one or more components on the circuit board modules are memory chips. These circuit board modules are adapted to communicate with the circuit board via the connectors on each circuit board module. These circuit board modules may be circular or of any geometric shape. The connectors of this embodiment may comprise a post mechanically connected to the circuit board with a predetermined cross-sectional shape comprising at least one set of electrical contacts and each circuit board module may have a center aperture that is congruent with a peripheral edge of the predetermined cross-sectional shape of the post and with at least one set of electrical contacts in contact with the set of contacts on the post.

Another embodiment of the present invention comprises a circuit board with a circular board with memory chips disposed in a circular array around a center of the circular board, an apparatus for connecting the circular board to another circuit board; an input-output device on the circular board located in a position that is approximately equal distant from each of the memory chips; a first array of equidistant electrical connection lines between the input-output device and the memory chips; and a second array of electrical connection lines between the input-output device and the apparatus for connecting the circular board to the circuit board. The apparatus for connecting the circular board to a circuit board may comprise a post mechanically connected to the circuit board with a predetermined cross-sectional shape; and the circular board having a center aperture that is congruent with a peripheral edge of the predetermined cross-sectional shape of the post. The center aperture may have a first set of electrical contacts and the post having a second set of electrical contacts at its peripheral edge, the first and second set of electrical contacts being configured such that when the circular board is placed over the post so that its aperture is around the post, the first and second electrical contacts detachably connect to each other and provide an electrical connection and mechanical connection for the circular board to the post. The post may provide electrical connections between the second connection and the circuit board. This post may also have at least one conduit for the passage of air through it. The at least one conduit may have a first opening for injection of air and at least one opening adjacent to the second set of electrical contacts to allow passage of air from the conduit and over the circular board.

Another embodiment of the present invention is a method of manufacturing a circuit board with radially arrayed components. This method may include, for example, the steps of providing a circuit board module with a connector, placing or disposing components radially about the connector, and then electrically connecting the components with the connector. The method may further include, for example, providing a main circuit board with a connector and connecting the main circuit board with the circuit board module. A second circuit board module may also be stacked upon the first circuit board. A third, fourth, and fifth circuit board modules etc. may also be stacked.

DETAILED DESCRIPTION OF THE PREFERRED EMBODIMENT

Figure 1:
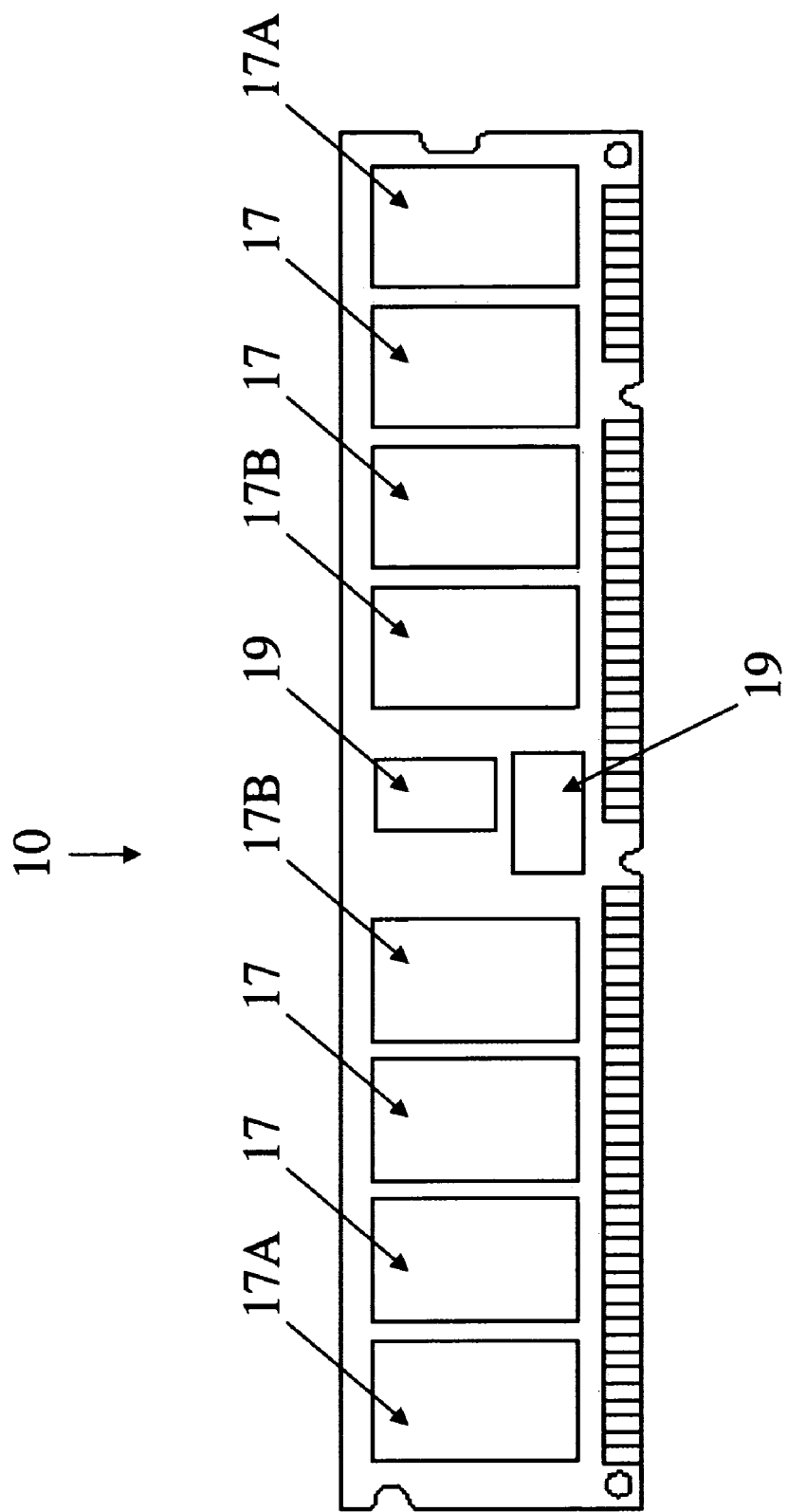
FIG. 1 is a face view of a prior art memory board.

One of the primary advantages of the design of the memory board of the present invention is that many, all, or substantially all of the data, address and control lines may be of substantially equal length. This ensures, for example, that each memory chip or component can receive data at nearly the same time without the need to add what would be unnecessary length to the various data paths. One of the more difficult problems in designing a memory board is assuring that the data and the control lines, connected to each memory chip or component, are approximately the same lengths. Maintaining the same length of the data lines is useful, for example, so that during a read or write operations all of the bits of information accessed or saved on the memory chip move over the same distance and arrive at the desired destination at substantially the same time One embodiment of the present invention is a circular memory board 20, shown in FIG. 2. Memory chips 27 may be located radially in a circle around the surface of the memory board 20. Control chips 29, for example, can be located around the center opening and post connector 21 of memory board 20. A circular memory board or disc 20 may be, for example, connected to a computer mother board through a center post or support such as that shown in FIG. 3. In such an embodiment data paths, i.e. first array of connections 110, from the center opening and post connector 21 to control chips 29 may, for example, be of substantially equal length. Furthermore, data paths, i.e. second array of connections 111, from control chips 29 to memory chips 27 may likewise, for example, be of substantially the same length.

Figure 3:
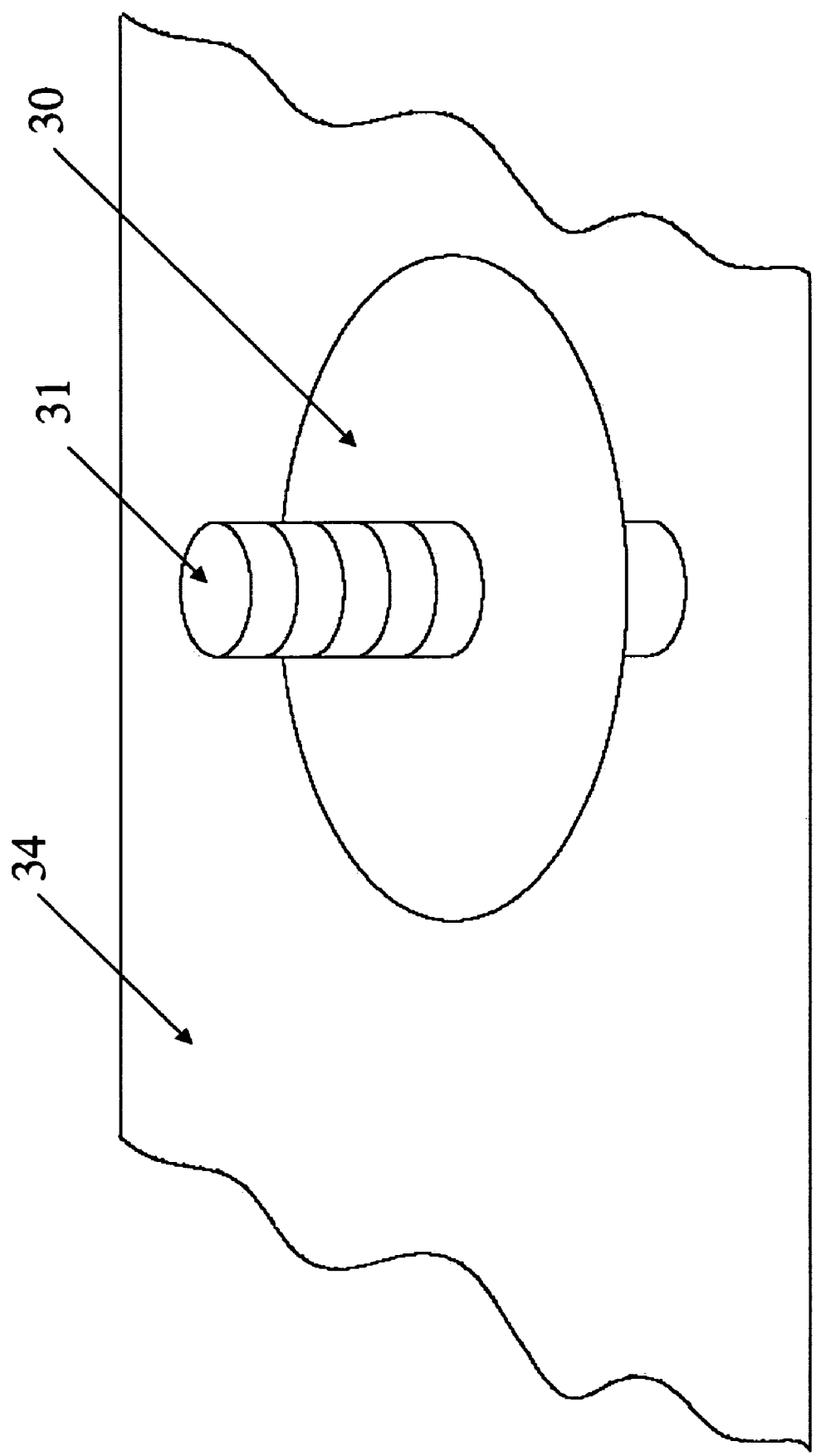
FIG. 3 is a perspective view of an embodiment of a circular memory board of FIG. 2 including a post that connects it to a computer circuit board.

FIG. 3 shows, for example, post 31 that may be attached to a computer circuit board 34. The data, address and control lines may, for example, pass from the computer circuit board through or on post or support 31 to various memory boards 30 that may be detachably connected to the post 31 to a computer circuit board 34. Circuit board 34, which only appears in a cut away view in FIG. 3, may be a standard computer motherboard of a desktop computer, the main circuit board of a portable computer or other circuit boards used in any electronic equipment.

Figure 2:
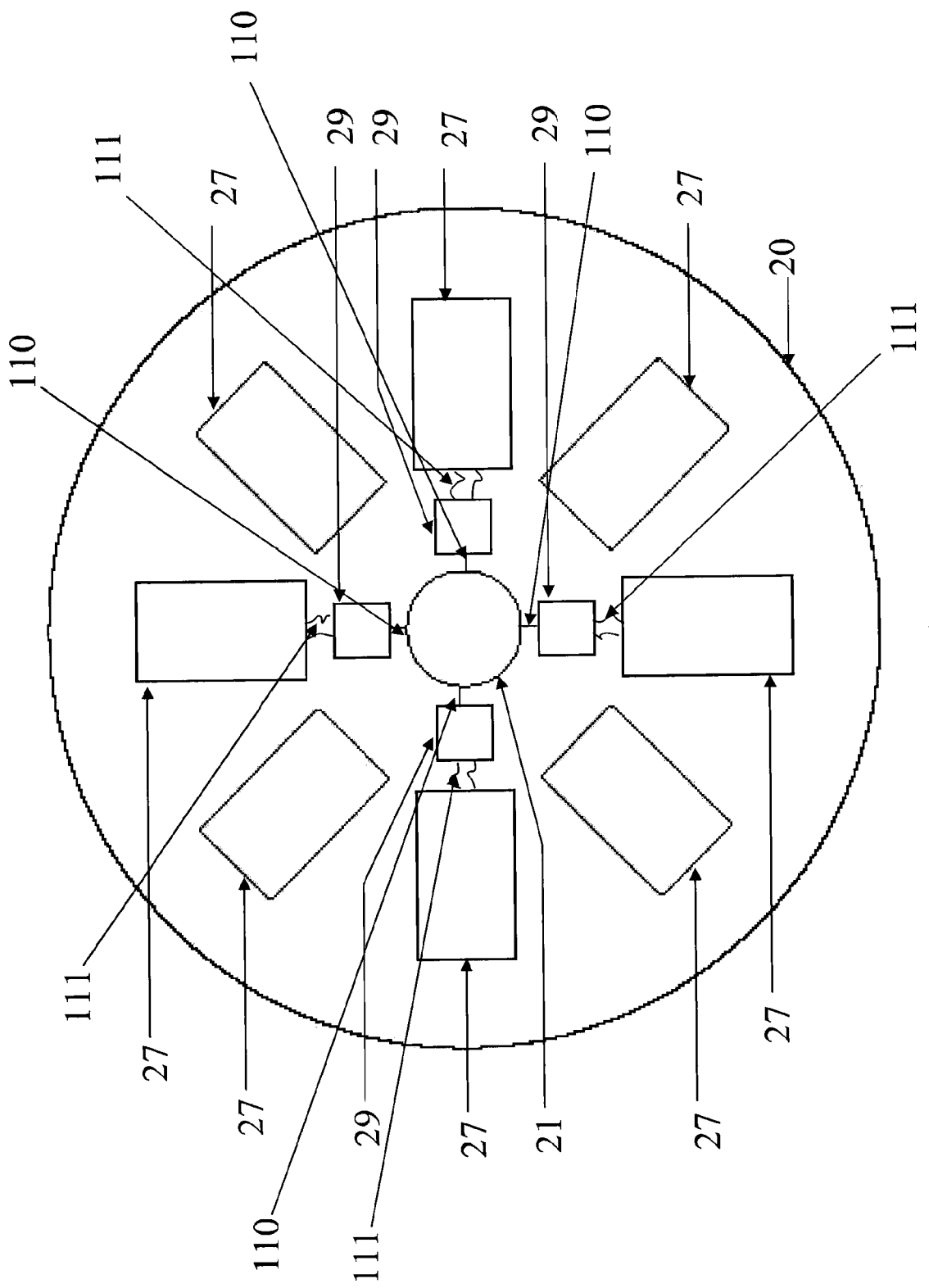
FIG. 2 is a top plan view of one example of a embodiment of the present invention.
Figure 4:
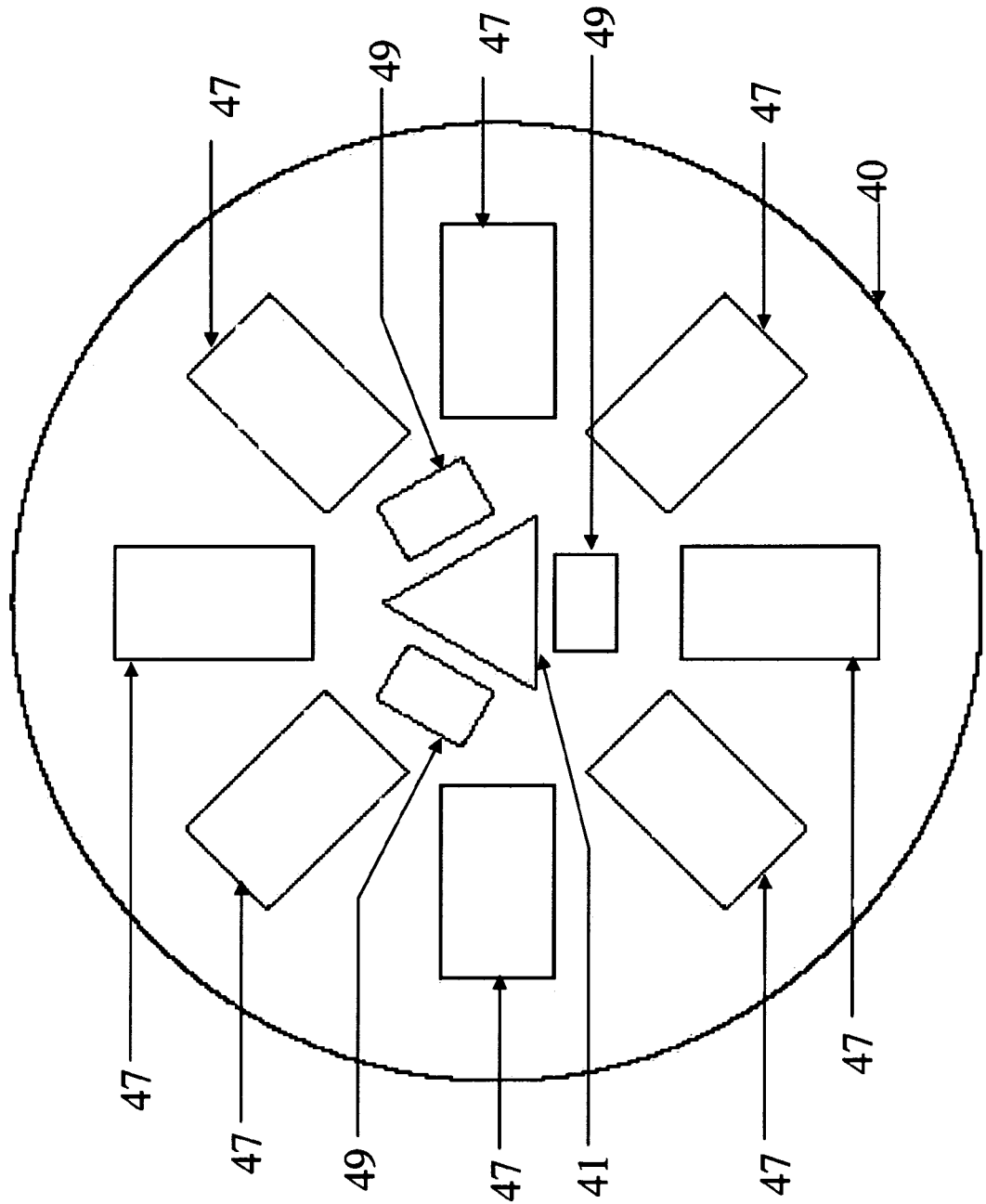
FIG. 4 is top plan view of another embodiment of the present invention.

FIG. 4 provides a view of another embodiment of a circular memory board 40 of the present invention. In FIG. 4, memory chips 47 may again be arranged in a circle around the center of the board. Memory chips 47 can be positioned, for example, at approximately an equal distance from the center opening and post connector 41. Control chips 49 may also be positioned around the center opening and post connector 41. One difference between the memory board 40 of this embodiment and that shown in FIG. 2 is that the center opening and post connector 41 is triangular in shape and thus may be attached to, for example, a triangular center post or support as shown in FIG. 5.

Figure 5:
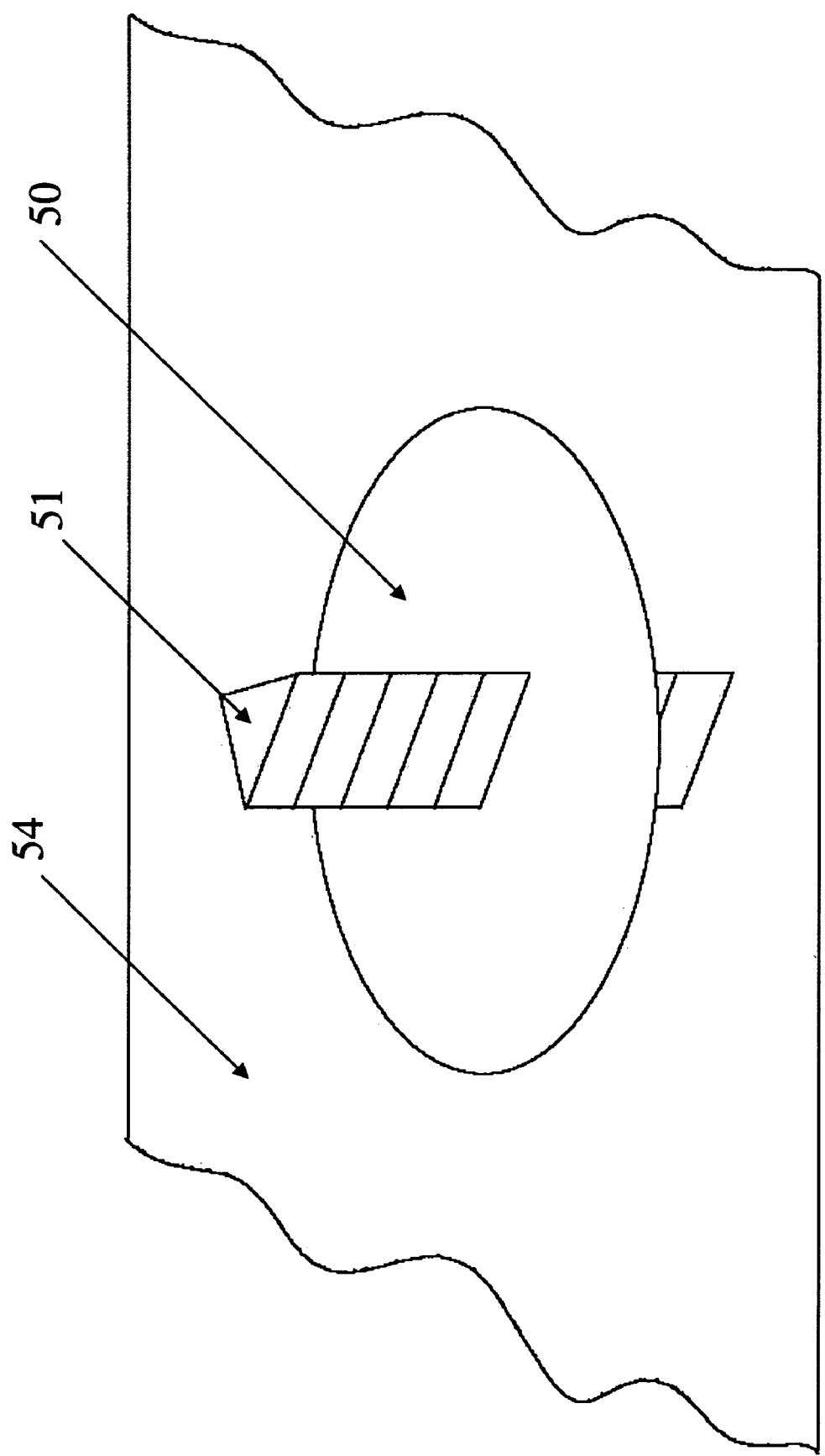
FIG. 5 is a perspective view of an embodiment of a circular memory board of FIG. 4 attached to a post that connects it to a computer circuit board.

In FIG. 5, for example, post 51 may be attached, for example to a computer circuit board 54 and the data, address and control lines may, for example, pass from the computer circuit board 54 through or on post 51 to each memory board 50 attached to post 51. Here again computer circuit board 54, which only appears in a cut away view in FIG. 5, may be, for example, a standard computer motherboard of a desktop computer, main circuit board of a portable computer or other circuit board. Alternatively, an embodiment of this invention may include posts 51 with a square, rectangular, or any other acceptable shape.

The circuit boards in these embodiments may be constructed in the same or similar fashion as typical circuit boards. For example, they may be constructed with one or more of various configurations such as multi-layered with alternating conductive layers, conductive paths, and vias between the layers. At least one layer may provide power and ground. These boards may also be fabricated with alternating conductive and prepreg layers. Any type of circuit board may be used as a radial circuit board without deviating from the embodiments of the invention.

Figure 6:
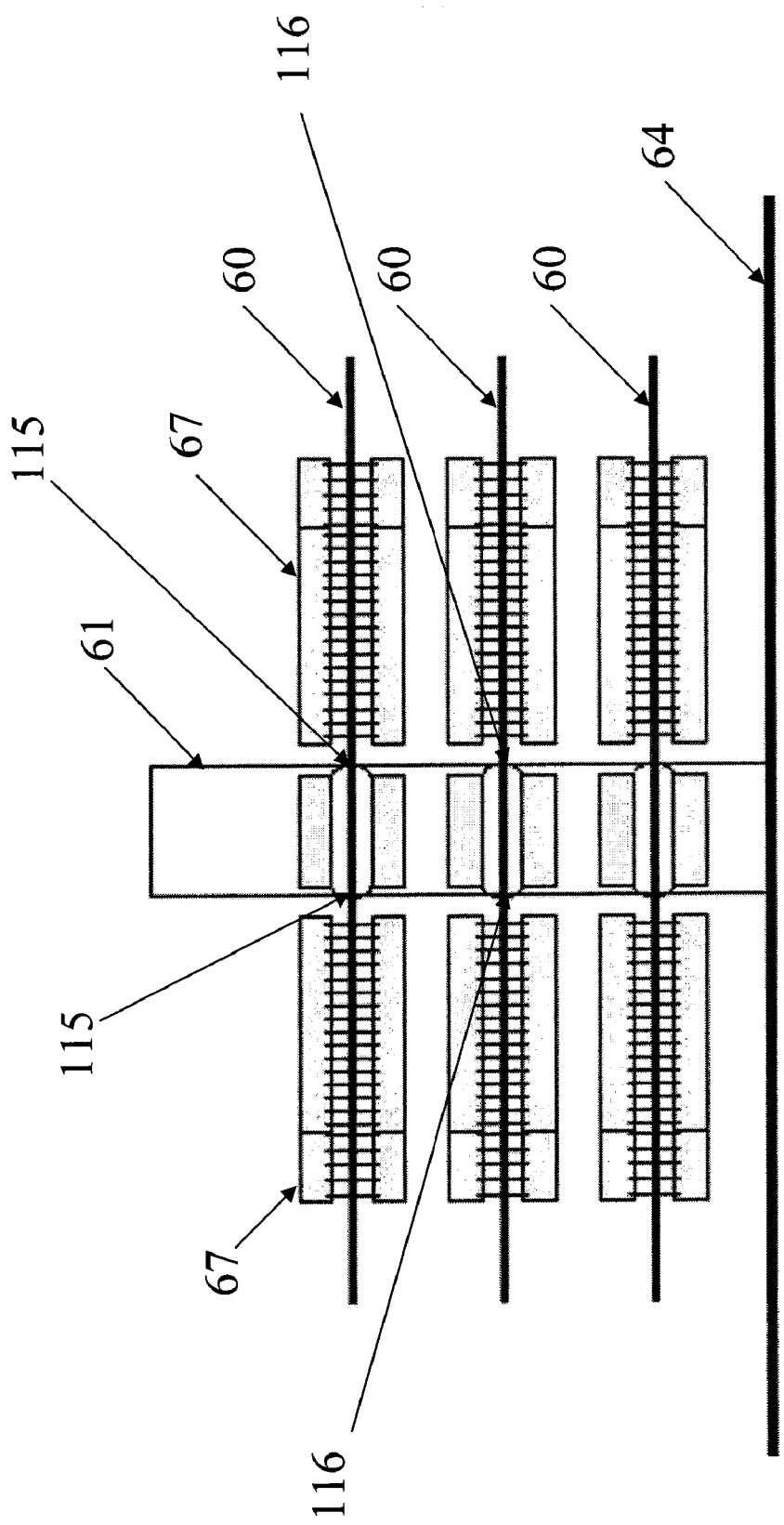
FIG. 6 is a side view of an embodiment of several circular memory boards connected to a post that connects them to a computer circuit board.

FIG. 6 shows a side view of a stack of three radial circuit boards 60 around a center support 61. These three radial circuit boards each have a variety of chips 67 disposed thereon, including, for example, memory chips. Center support 61 electrically connects the radial circuit boards 60 to the motherboard 64 of, for example, a computer. The center aperture may have first array of connections 115 and a second array of connections 116 at its peripheral edge. In one embodiment, for example, the actual height of center post 61 with circular memory boards attached to it may be an inch or less in height. In other embodiments the height of the center post 61 may be over one inch. Furthermore, any number of radial circuit boards 60 may be stacked. For example, four, five or six radial circuit boards may be stacked around a center post 61.

Figure 7:
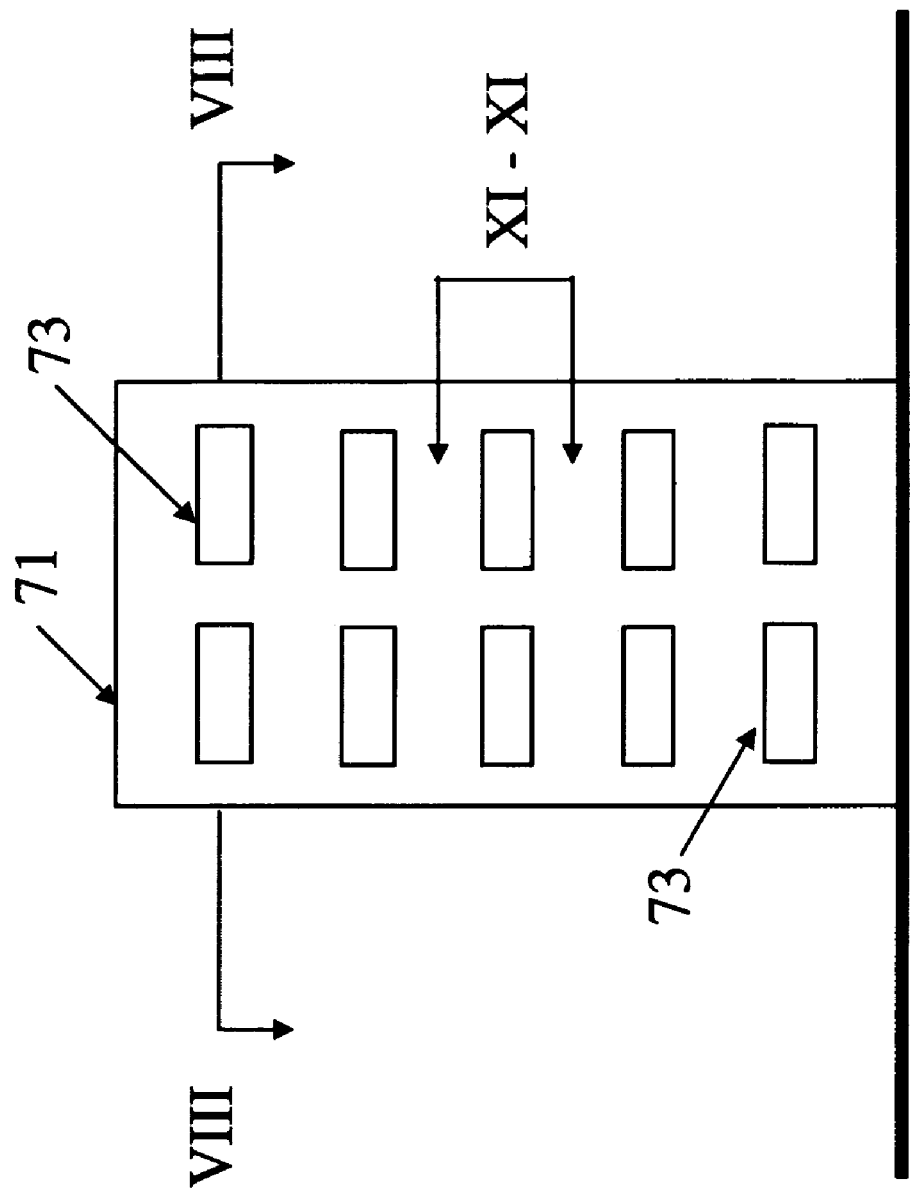
FIG. 7 is a view a center post according to another embodiment of the present invention.

FIG. 7 is a raised view of one of the faces of the post 71 in FIG. 4. FIG. 7 shows openings 73 arranged down the face of the post 71. In this specific embodiment, center post 71, for example, may have a hollow interior. Openings 73 allow air to flow into and out of the hollow center of post 71. Providing a hollow core or interior with openings 71, for example, will allow air injected into the core 71 to pass out through openings 73, cooling the memory boards attached to center post 71. In order to enhance the flow of air out across the memory boards attached to post 71, fins may be included within the post to facilitate airflow from a hollow post.

Figure 8:
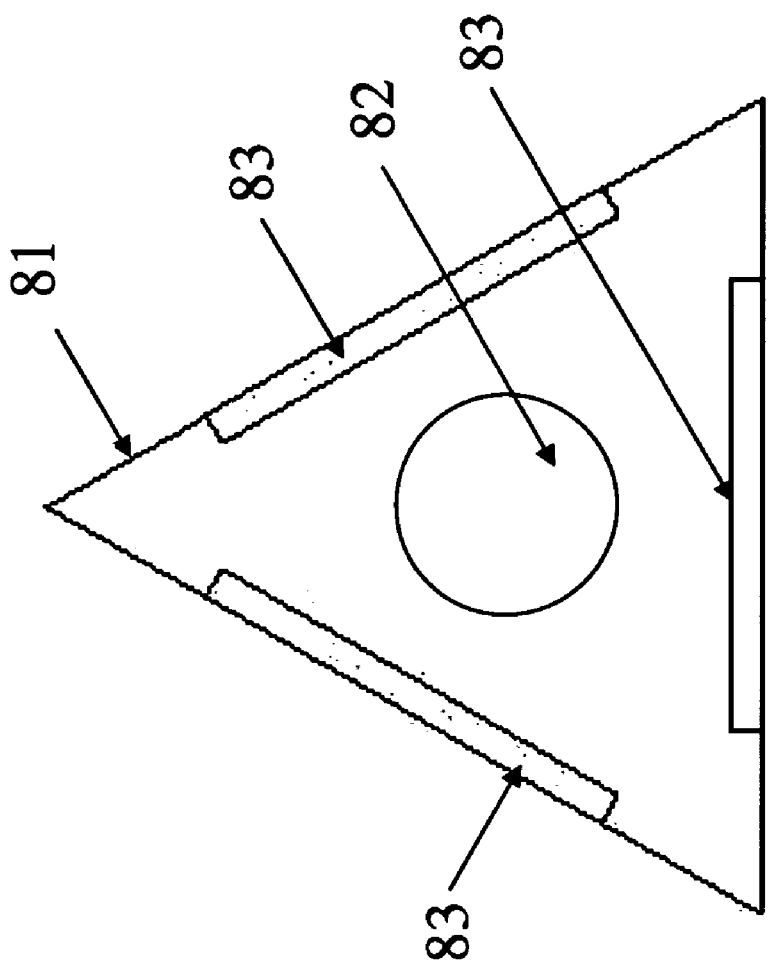
FIG. 8 is a view of an embodiment of a post of FIG. 7 along line VIII-VIII.

FIG. 8 shows a top cross-sectional view of a center post 81, for example, like one cut along line VIII-VIII of FIG. 7. The post 81 has a hollow center 82 that is visible in this figure. Vents 83 are also shown. These vents are positioned to allow air to flow onto stacked radial circuit boards to cool the components deposited thereon. The size and shape of the hollow center and the vents depend on the specific application.

Figure 9:
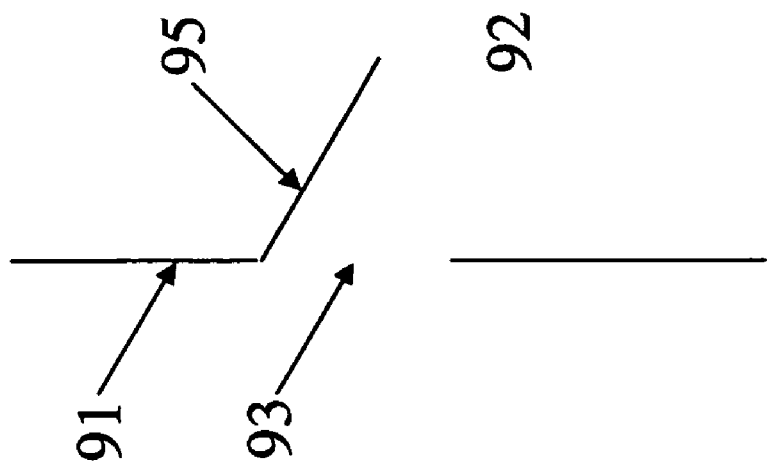
FIG. 9 is a cross-sectional view along line XI-XI of FIG. 7.

FIG. 9 shows a side view of one of the vents 93 in a post 91. This figure also shows a fin 95, according to another embodiment of the invention, projected into the hollow core 92 located at the top of openings 93. The fin 95 is designed to capture air and direct the air out over a circuit board.

Figure 10:
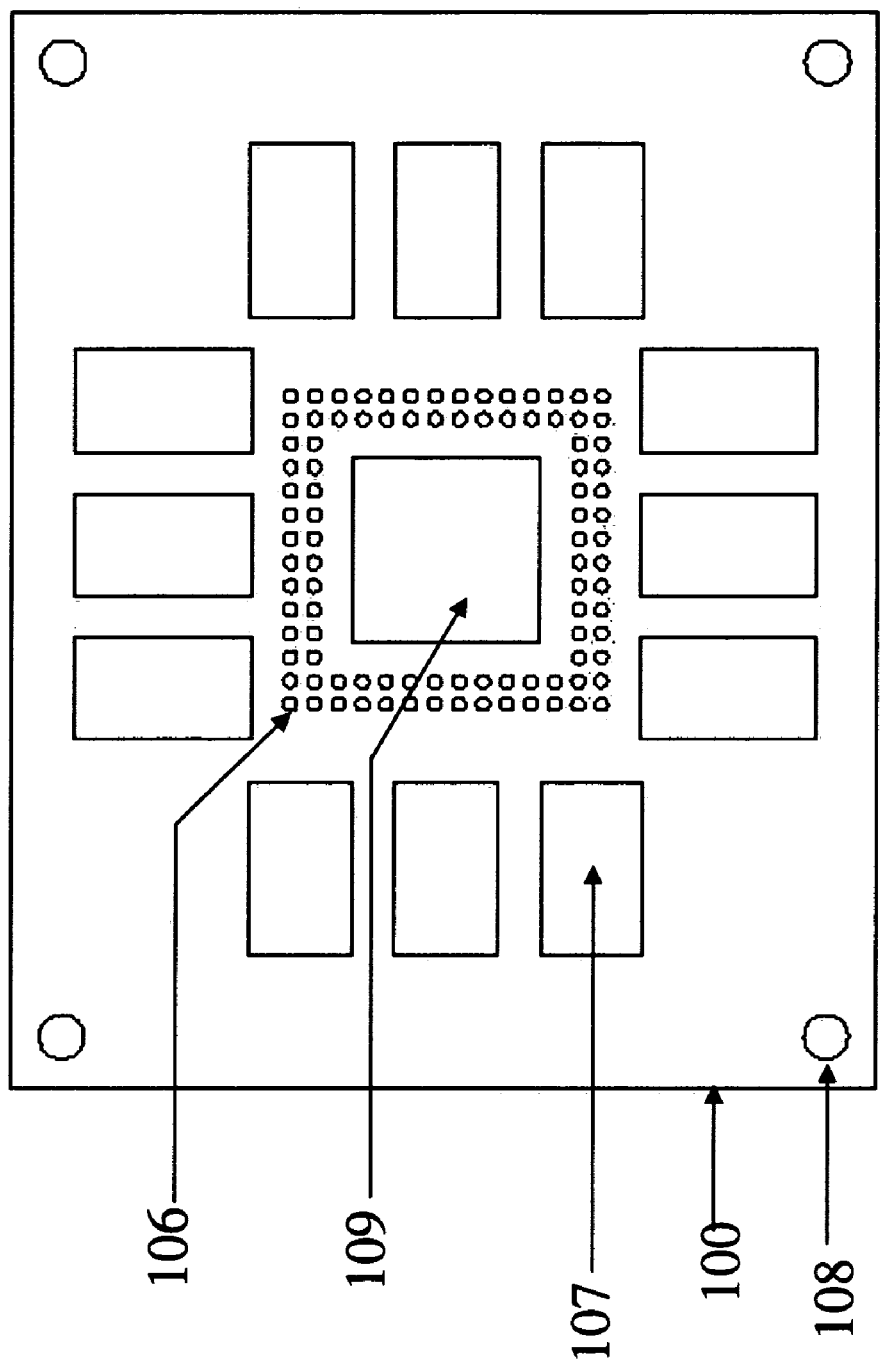
FIG. 10 is a top plan view of an embodiment of the present invention with components disposed on a circuit board.

FIG. 10 depicts another embodiment of the present invention. In FIG. 10, a square circuit board module 100 is shown. Memory chips 107 are disposed about the center of the board. The shape of the board in this embodiment is immaterial and may take any acceptable geometric shape (circle, square, triangle, polygon, diamond, etc.). This embodiment may also have a control chip 109 disposed in the center of the board with electrical connection lines arrayed from the central control chip to the various memory chips 107. Each electrical connection line may be approximately equidistant from the control chip 109 to each component 107. The control chip 109 of this embodiment may, for example, be fully buffered. The connector 106 of this embodiment allows a plurality of circuit board modules to be stacked upon each other. In such an arrangement, for example, each module may connect with a module above and below via the connector 106. The circuit board module on the bottom of the stack may connect directly to another circuit board, such as, for example, a mother board. The connectors 106 may, for example, comprise male-female or pressure pin type connectors. This arrangement may also use, for example, alignment posts 108 to aid in aligning the circuit boards for connecting. FIG. 10 shows these alignment posts 108 in the corners of the circuit board. The electrical connections from the control chip 109 to the components 107 may be approximately equidistant. Electrical connections from the connector 106 to the control chip 109 may also be approximately equidistant.

Although the invention has been particularly shown and described with reference to a number of embodiments thereof, it will be understood by those skilled in the art that various changes in form and detail may be made to it without departing from the spirit and scope of the invention.

What is claimed is:

1. A circuit board module comprising
    a connector;
    a plurality of components radially arrayed substantially equidistant around said connector; and
    an array of substantially equidistant electrical connections electrically coupling said connector and said components;
    at least one input-output device, wherein said array of substantially equidistant electrical connections connects the connector and said input-output devices; and
    a second array of substantially equidistant electrical connections positioned between said input-output device and said components.

2. The circuit board module of claim 1, wherein said input-output device comprises a fully buffered control chip.

3. The circuit board module of claim 1, wherein said input-output device comprises a plurality of control chips.

4. A circuit board module comprising:
    a connector;
    wherein said connector comprises pressure pins arrayed on the bottom of said circuit board module;
    a plurality of components radially arrayed substantially equidistant around said connector; and
    an array of substantially equidistant electrical connections electrically coupling said connector and said components.

5. The circuit board module of claim 4, further comprising a pressure pin pad array positioned on the top of said circuit board module configured to connect with the pressure pin connector of a second circuit board module.

6. A circuit board module comprising:
    a connector;
    wherein said connector comprises a male/female connector on the bottom of said circuit board module;
    a plurality of memory chips radially arrayed substantially equidistant around said connector; and
    an array of substantially equidistant electrical connections electrically coupling said connector and said components; and
    a male/female connector on the top of said circuit board module configured to connect with the male/female connector of a second circuit board module.

7. A circuit board module comprising:
    a connector;
    a plurality of memory chips radially arrayed substantially equidistant around said connector; and
    an array of substantially equidistant electrical connections electrically coupling said connector and said components; and
    wherein said connector further comprises:
    a post mechanically connected to a second circuit board with a predetermined cross-sectional shape; and wherein
    said circuit board module further comprises a center aperture that is congruent with a peripheral edge of said predetermined cross-sectional shape of said post;
    said center aperture having a first set of electrical contacts and said post having a second set of electrical contacts at its peripheral edge, said first and second set of electrical contacts being configured such that when said circuit board is placed over said post so that its aperture is around said post said first and second electrical contacts connect to each other and provide an electrical connection and mechanical connection for said circuit board to said post; and
    said post includes electrical connections between said second contacts and said second circuit board.

8. The circuit board module of claim 7, wherein said post has at least one conduit for the passage of air through it.

9. The circuit board module of claim 7, wherein said post and said aperture are detachably connected at said first and second electrical contacts.

10. The circuit board module of claim 8, wherein said at least one conduit has a first opening for injection of air and at least one opening adjacent to said second set of electrical contacts to allow passage of air from said conduit and over said circular board.

11. A stackable memory system comprising:
a circuit board; and
a plurality of circuit board modules comprising:
a connector;
a plurality of components radially arrayed substantially equidistant around said connector; and
an array of substantially equidistant electrical connections electrically coupling said connector and said components;
wherein one or more components on said circuit board modules are memory chips, and said circuit board modules are adapted to communicate with said circuit board via the connector on said circuit board module,
wherein said connectors comprise:
a post mechanically connected to said circuit board with a predetermined cross-sectional shape comprising at least one set of electrical contacts; and
wherein each circuit board module has a center aperture that is congruent with a peripheral edge of said predetermined cross-sectional shape of said post and with at least one set of electrical contacts in contact with the set of contacts on said post.

12. The stackable memory system of claim 11, wherein said circuit board modules are circular.

13. An apparatus comprising:
a first circuit board module with memory chips radially disposed;
a main circuit board;
an apparatus for connecting said first circuit board module over said main circuit board;
an input-output device on said first circuit board module located in a position that is approximately equal distant from each of the memory chips;
a first array of equidistant electrical connection lines between said input-output device and said memory chips; and
a second array of electrical connection lines between said input-output device and said apparatus for connecting said circuit board to said main circuit board.

14. The apparatus of claim 13, wherein the shape of said first circuit board is selected from the group consisting of a circle, rectangle, square, and polygon.

15. The apparatus of claim 13, wherein said main circuit board comprises a mother board.

16. The apparatus of claim 13, wherein said apparatus for connecting said first circuit board to said main circuit board comprises a post mechanically connected to said main circuit board with a predetermined cross-sectional shape and wherein said post has a first set of electrical contacts at its peripheral edge.

17. The apparatus of claim 16, wherein said first circuit board has a center aperture that is congruent with a peripheral edge of said predetermined cross-sectional shape of said post and wherein said center aperture has a second set of electrical contacts, and wherein said first and second set of electrical contacts being configured such that when said first circuit board is placed over said post so that its aperture is around said post said first and second electrical contacts detachably connect to each other and provide an electrical connection for said first circuit board to said post.

18. The apparatus of claim 16, wherein said post includes electrical connections between said first electrical contacts and said main circuit board.

19. The apparatus of claim 16, wherein said post has at least one conduit for the passage of air through it.

20. The apparatus of claim 19, wherein said at least one conduit has at least one opening adjacent to said second set of electrical contacts to allow passage of air from said conduit and over said first circuit board.

21. The apparatus of claim 19, further comprising a second circuit board similar to said first circuit board stacked upon said first circuit board and electrically connected to said post.

22. A method of manufacturing comprising:
providing a circuit board module;
providing a circuit board module connector on said circuit board module;
disposing a plurality of components radially arrayed substantially equidistant around said connector;
electrically connecting said components to said circuit board module connector;
providing a main circuit board with a main circuit board connector; and
connecting said circuit module connector with said main circuit board connector.

23. The method of claim 22, further comprising disposing at least one input-output device on said circuit board module.

24. The method of claim 22, further comprising disposing at least one fully buffered control chip on said circuit board module.

25. The method of claim 22, wherein said electrically connecting step further comprises the step of providing an array of substantially equidistant electrical connections between said connector and said components.

26. The method of claim 22, further comprising providing alignment pins on said circuit board module.

27. The method of claim 22, wherein said main circuit board connector comprises a post.

28. The method of claim 22, further comprising providing a second circuit board module with a connector and connecting said second circuit board module with said main circuit board.

29. The method of claim 22, further comprising providing a second circuit board module with a connector and connecting said second circuit board module with said first circuit board module.

30. A method of stacking circuit board modules comprising:
providing a main circuit board with a connector; and
providing first and second circuit board modules with components radially disposed substantially equidistance from a connector on aid circuit board module;
wherein said first circuit board is connected to said main circuit board and said second circuit board is connected to said first circuit board.

31. The method of claim 30, further comprising providing a third circuit board module with components radially disposed about a connector on said circuit board module and wherein said third circuit board is connected to said second circuit board.

32. The method of claim 30, wherein said connector is a male/female connector.

33. A method of stacking circuit board modules comprising:
providing a main circuit board with a post comprising a predetermined cross-sectional shape;

providing a first and second circuit board module with components radially disposed substantially equidistant from an aperture that is congruent with a peripheral edge of said predetermine cross-sectional shape of said post;

stacking said first and second circuit board modules one over another; and coupling said first and second circuit board modules with said post.

34. The method of stacking circuit board modules of claim 33, wherein said coupling step further comprises electrically coupling.

35. The method of stacking circuit board modules of claim 33, wherein said coupling step further comprising mechanically coupling.

36. The method of stacking circuit board modules of claim 33, further comprising providing alignment pins on said circuit board modules.

37. The method of stacking circuit board modules of claim 33, further comprising providing a conduit within said post for the passage of air.

* * * * *